United States Patent [19]

Baney et al.

[11] Patent Number: 5,358,739
[45] Date of Patent: Oct. 25, 1994

[54] COATING ELECTRONIC SUBSTRATES WITH SILICA DERIVED FROM SILAZANE POLYMERS

[75] Inventors: Ronald H. Baney, Tokyo, Japan; Grish Chandra; Loren A. Haluska, both of Midland, Mich.

[73] Assignee: Dow Corning Corporation, Midland, Mich.

[21] Appl. No.: 209,321

[22] Filed: Mar. 10, 1994

Related U.S. Application Data

[63] Continuation of Ser. No. 13,873, Feb. 5, 1993, abandoned.

[51] Int. Cl.$^5$ ............................................. B05D 3/02
[52] U.S. Cl. ................................. 427/226; 427/228; 427/387; 437/231; 437/238; 528/38
[58] Field of Search .............. 427/226, 228, 248.1, 427/249, 387; 528/38; 437/231, 238

[56] References Cited

U.S. PATENT DOCUMENTS

| | | | |
|---|---|---|---|
| 4,719,125 | 1/1988 | Anello et al. | 437/231 |
| 4,746,480 | 5/1988 | Clark | 427/248.1 X |
| 4,749,631 | 6/1988 | Haluska et al. | 428/704 |
| 4,756,977 | 7/1988 | Haluska et al. | 428/704 |
| 4,826,733 | 5/1989 | Haluska et al. | 428/447 |
| 5,086,126 | 2/1992 | Mahone | 528/38 X |
| 5,152,819 | 10/1992 | Blackwell et al. | 427/255.1 X |
| 5,176,941 | 1/1993 | Peuckert et al. | 427/226 |

FOREIGN PATENT DOCUMENTS

| | | |
|---|---|---|
| 1-221466 | 9/1989 | Japan . |
| 4-285958 | 10/1992 | Japan . |
| 4-320055 | 11/1992 | Japan . |
| 5-32410 | 2/1993 | Japan . |
| WO/9302472 | 2/1993 | PCT Int'l Appl. . |

OTHER PUBLICATIONS

"Accuglass Siloxane Spin-On Glasses", Planarization and Diffusion Products, Allied, pp. 1-7, May, 1987.

*Primary Examiner*—Michael Lusignan
*Attorney, Agent, or Firm*—Roger E. Gobrogge

[57] ABSTRACT

A silica coating is formed on an electronic substrate by applying a silazane polymer on the substrate and converting it to silica by heating in an oxidizing environment. The resultant thick planarizing coatings are useful as protective coatings and dielectric inner layers.

9 Claims, No Drawings

COATING ELECTRONIC SUBSTRATES WITH SILICA DERIVED FROM SILAZANE POLYMERS

This is a continuation of copending application(s) Ser. No. 08/013,873 filed on Feb. 5, 1993, now abandoned.

BACKGROUND OF THE INVENTION

The present invention relates to a novel method of applying silica coatings on electronic substrates. The novelty herein resides in the fact that silazane polymers are used as silica precursors.

Various methods for the application of ceramic coatings on electronic devices are known in the art. For instance, it is known to use gaseous precursors in a variety of vapor deposition processes to produce coatings of silica, silicon nitride, silicon oxynitride, silicon carbide and the like. These coatings are taught to be useful as protective and dielectric layers.

Similarly, the use of polymeric precursors for depositing ceramic coatings on electronic devices is also known in the art. For instance, Haluska et al. in U.S. Pat. Nos. 4,749,631 and 4,756,977 and the Accuglass ™ product literature disclose silica coatings produced by applying solutions of silica precursors to the devices and then heating the coated devices to convert the precursors to silica. These references, however, do not disclose the use of polysilazanes as the silica precursors.

Finally, the use of polysilazanes for applying silicon and nitrogen containing ceramic coatings on electronic devices is also known in the art. For example, Haluska et al. in U.S. Pat. Nos. 4,756,977 and 4,826,733 teach forming ceramic coatings by applying coatings of silicon and nitrogen containing polymers such as polysilazanes on such devices and then heating the coated devices in an inert atmosphere. Since the coatings are heated in an inert atmosphere, the nitrogen is maintained in the coating and, thus, silica is not formed.

The present inventors have now discovered that silica coatings derived from silazane polymers can be applied on electronic substrates. Since the resultant coatings are thick, planar and defect free, they can be used as protective and dielectric layers.

SUMMARY OF THE INVENTION

The present invention relates to a method for depositing a silica coating on an electronic substrate. The method comprises first applying a coating comprising a silazane polymer on an electronic substrate. The coated substrate is then heated in an oxidizing atmosphere at a temperature sufficient to convert the silazane polymer to a silica coating.

DETAILED DESCRIPTION OF THE INVENTION

The present invention is based on the discovery that preceramic silazane polymers can be used to form desirable silica coatings on electronic substrates. This was particularly unexpected since it was not known whether silazane polymers could be converted to silica on electronic substrates without damaging the substrates and whether these coatings would have useful effects in the electronics industry.

As used in the present invention, the expression "silica" refers to those pyrolyzed materials containing Si—O—Si bonds which may or may not be fully free of residual Si—C, Si—H, Si—OH, Si—OC, Si—N, N—H and/or N—C but which are otherwise ceramic in character; the expression "planarizing coating" refers to a coating which is less irregular than the surface prior to application of the coating; and the expression "electronic substrate" includes, but is not limited to silicon based devices, gallium arsenide based devices, focal plane arrays, opto-electronic devices, photovoltaic cells, optical devices, flat panel displays, and integrated circuits at both wafer and assembly stage. Specific examples of such substrates include transistor-like devices, capacitor and capacitor-like devices, multilayer devices, 3-D devices, silicon on insulator devices, super lattice devices and the like.

The process of the present invention involves applying a coating comprising a silazane polymer on an electronic substrate and then heating the coated substrate in an oxidizing atmosphere at a temperature sufficient to convert the silazane polymer to a silica coating.

The polysilazanes (or silazane polymers) useful in this invention are generally well known in the art and their structure is not particularly critical. The polysilazanes of this invention generally contain units of the type [$R_2SiNH$], [$RSi(NH)_{1.5}$] and/or [$R_3Si(NH)_{\frac{1}{2}}$] wherein each R is independently selected from the group consisting of hydrogen, alkyl radicals containing 1 to 20 carbon atoms, aryl radicals, and alkenyl radicals. Naturally, the polysilazanes useful in this invention may contain other silazane units. Examples of such units include [$MeSi(NH)_{1.5}$], [$Me_2SiNH$], [$ViSi(NH)_{1.5}$], [$Vi_2SiNH$], [$PhMeSiNH$], [$PhViSiNH$], [$MeViSiNH$], [$HSi(NH)_{1.5}$], [$H_2SiNH$], and the like. Mixtures of polysilazanes may also be employed in the practice of this invention.

The polysilazanes of this invention can be prepared by techniques well known in the art. The actual method used to prepare the polysilazane is not critical. Suitable preceramic silazane polymers or polysilazanes may be prepared by the methods of Cannady in U.S. Pat. Nos. 4,540,803 (issued Sep. 10, 1985) and 4,543,344 (issued Sep. 24, 1985) which are hereby incorporated by reference. Other polysilazanes suitable for use in this invention can be prepared by the methods of Gaul in U.S. Pat. Nos. 4,312,970 (issued Jan. 26, 1982), 4,340,619 (issued Jul. 20, 1982), 4,395,460 (issued Jul. 26, 1983), and 4,404,153 (issued Sep. 13, 1983), all of which are hereby incorporated by reference. Suitable polysilazanes also include those prepared by the methods of Haluska in U.S. Pat. No. 4,482,689 (issued Nov. 13, 1984) and Seyferth et al. in U.S. Pat. No. 4,397,828 (issued Aug. 9, 1983), both of which are hereby incorporated by reference. Still other polysilazanes include those of Gerdau et al. in European Patent 351,747, those of U.S. Pat. No. 4,543,344, those of European Patent 332,374, those of Lebrun et al. in U.S. Pat. Nos. 4,656,300 and 4,689,252 and those of Funayama et al. in U.S. Pat. No. 5,030,744, the disclosures of which are all hereby incorporated by reference.

Especially preferred polysilazanes are those which have no carbon in the repeating units of the polymer since the resultant coatings have little carbon contamination. End blocking groups such as $Me_3Si(NH)_{\frac{1}{2}}$ are acceptable in such polymers since they will be removed during the subsequent pyrolysis steps.

The most preferred polymers to be used herein are those of Gaul in U.S. Pat. No. 4,340,619 and those of Cannady in U.S. Pat. No. 4,540,803, brief descriptions of which will now be provided. The silazane polymers of Gaul are prepared by contacting and reacting in an inert, essentially anhydrous atmosphere a chlorine containing disilane or mixture of chlorine containing disilanes of the general formula $(Cl_xR_ySi)_2$ with a disilazane having the general formula $(R_3'Si)_2NH$ at a temperature in the range of 25° C. to 300° C. while distilling volatile byproducts, wherein R is vinyl, an alkyl group of 1–3 carbon atoms or a phenyl group; R' is vinyl, hydrogen an alkyl group of 1–3 carbon atoms or a phenyl group; x has a value of 0.5–3; y has a value of 0–2.5 and the sum of x+y equals 3.

The chlorine containing disilanes of Gaul have the general formula $(Cl_xR_ySi)_2$ where R is vinyl, an alkyl group of 1–3 carbon atoms or a phenyl group. Thus, the R groups are independently selected from the group consisting of methyl, ethyl, propyl, vinyl and phenyl. Examples of these chlorine containing disilanes include $[Cl(CH_3)_2]Si_2$, $[Cl_2CH_3Si]_2$, $[Cl_2C_2H_5Si]_2$, $[Cl(C_6H_5)_2Si]_2$, $[Cl_2CH_2=CHSi]_2$, $[Cl(C_6H_5)_2SiSi(CH_3)_2Cl$.

Monosilanes may also be used in admixture with the above described chlorine containing dislianas. Examples of such monosilanes include $CH_3SiCl_3$, $H(CH_3)_2SiCl$, $(CH_3)_2SiCl_2$, $(CH_3)_3SiCl$, $(CH_2=CH)(CH_3)_2SiCl$, $(C_2H_5)_2SiCl_2$, $C_6H_5SiCl_3$ as well as $(C_6H_5(_2SiCl_2$ and $(C_6H_5)_3SiCl$.

The disilazane used in the Gaul invention has the formula $(R_3'Si)_2NH$, where R' is vinyl, hydrogen, an alkyl group of 1–3 carbon atoms or a phenyl group. Thus, the R' groups are independently selected from the group consisting of hydrogen, methyl, ethyl, propyl, vinyl and phenyl. Examples of suitable disilazanes include $[(CH_3)_3Si]_2NH$, $[C_6H_5(CH_3)_2Si]_2NH$, $[(C_6H_5)_2CH_3Si]_2NH$, $[CH_2=CH(CH_3)_2Si]_2NH$, $[CH_2=CH(CH_3)C_6H_5Si]_2NH$, $[CH_2=CH(C_6H_5)_2Si]_2NH$, $[CH_2=CH(C_2H_5)_2Si]_2NH$, $[H(CH_3)_2Si]_2NH$, and $[CH_2=CH(C_6H_5)C_2H_5Si]_2NH$.

An especially preferred embodiment of the Gaul invention involves the reaction of methylchlorodisilanes with hexamethyldisilazane to produce methylpolydisilylazane.

The above reactants are brought together in an inert, essentially anhydrous atmosphere. By inert it is meant that the reaction is carried out under a blanket of inert gas such as argon, nitrogen or helium. What is meant by essentially anhydrous is that the reaction is preferably carried out in an absolutely anhydrous atmosphere but minute amounts of moisture can be tolerated.

When the reactants are contacted with each other an intermediate amino compound is formed. Upon continued heating $R_3SiCl$ is distilled from the reaction mixture and the silazane polymer formed. As the temperature of reaction is raised, more condensation takes place and crosslinking occurs. This control allows one to stop the reaction at any point to obtain almost any desired viscosity. The desired temperature range for the reaction is 25° C. to 300° C. with a temperature in the range of 125° C. to 300° C. being more preferred. The length of time that the reaction requires depends on the temperature employed and the viscosity one wishes to achieve.

The above described silazane polymers of Gaul may have a relatively high chloride ion content and it is preferred that such concentration be lowered before use in the present invention. A method for such removal is described in U.S. Pat. No. 4,772,516 granted to Mahone, which is hereby incorporated by reference. The method described therein comprises treating the polymer with ammonia for a time sufficient to remove the chlorine.

The silazane polymers of Cannady are prepared by a method which comprises contacting and reacting in an inert essentially anhydrous atmosphere, trichlorosilane with a disilazane at a temperature in the range of 25° C. to 300° C. while distilling volatile byproducts. The disilazane used in the process has the formula $(R_3Si)_2NH$ where R is selected from the group consisting of vinyl, hydrogen, phenyl and alkyl radicals containing 1 to 3 carbon atoms.

The trichlorosilane is treated with the disilazane in sufficient amounts to react with all of the chlorine in the chlorine containing silane. This is usually an equimolar amount based on the chlorine content of the trichlorosilane.

The disilazane used in the Cannady invention has the formula $(R_3Si)_2NH$, where R is vinyl, hydrogen, an alkyl group of 1–3 carbon atoms or a phenyl group. Thus, the R' groups are independently selected from the group consisting of hydrogen, methyl, ethyl, propyl, vinyl and phenyl. Examples of suitable disilazanes include $[(CH_3)_3Si]_2NH$, $[C_6H_5(CH_3)_2Si]_2NH$, $[(C_6H_5)_2NH$, $[CH_2=CH(CH_3)_2Si]_2NH$, $[CH_2=CH(CH_3)C_6H_5Si]_2NH$, $[CH_2=CH(C_6H_5)_2Si]_2NH$, $[CH_2=CH(C_2H_5)_2Si]_2NH$, $[H(CH_3)_2Si]_2NH$, and $[CH_2=CH(C_6H_5)C_2H_5Si]_2NH$.

An especially preferred embodiment of the Cannady invention involves the reaction of trichlorosilane with hexamethyldisilazane to produce hydridopolysilazane.

The above reactants are brought together in an inert, essentially anhydrous atmosphere. By inert it is meant that the reaction is carried out under a blanket of inert gas such as argon, nitrogen or helium. What is meant by essentially anhydrous is that the reaction is preferably carried out in an absolutely anhydrous atmosphere but minute amounts of moisture can be tolerated.

When the reactants are contacted with each other an intermediate amino compound is formed. It is preferred that the reactants are brought together in such a manner to keep the initial reaction exotherm to a minimum. Upon continued heating additional amino compound is formed and, with further heating, $R_3SiCl$ is distilled from the reaction mixture and the silazane polymer formed. For best results, the rate of heating should be controlled at a rate of less than about 1° C./min. A heating rate of about 0.5° C./min. or less is preferred. As the temperature of reaction is raised, more condensation takes place and crosslinking occurs with residual $R_3Si$ that is not distilled from the mixture acting as a chain stopper. This control allows one to stop the reaction at any point to obtain almost any desired viscosity. The desired temperature range for the reaction is 25° C. to 300° C. with a temperature in the range of 125° C. to 275° C. being more preferred. The length of time that the reaction requires depends on the temperature employed and the viscosity one wishes to achieve.

Although only several polymers are described above, nearly any polysilazane may be used herein.

The above silazane is first applied to the substrate to form a preceramic coating. Although any conventional technique may be used, it is particularly preferred to coat the substrate with a solution comprising a solvent and the silazane. Removal of the solvent by evaporation or a similar technique yields the preceramic coating. Other equivalent methods such as melt coating, however, are also contemplated herein.

If the above solution method is used, the silazane is first dissolved in a solvent. Various facilitating measures such as stirring and/or heating may be used to aid in the dissolution. Solvents which may be used include any which will dissolve the silazane to form a solution or suspension without affecting the coating. These solvents can include, for example, aromatic hydrocarbons such as xylene, benzene or toluene, alkanes such as n-heptane, decane or dodecane, ketones, esters, glycol ethers, or cyclic dimethylpolysiloxanes, in an amount sufficient to dissolve the above materials. Generally, enough of the above solvent is used to form a 0.1–50 weight percent solution.

If the above solution method is used, the coating solution is applied by techniques such as spin coating, dip coating, spray coating or flow coating. Evaporation of the solvent by any suitable means such as simple air drying by exposure to an ambient environment or by the application of a vacuum or mild heat yields the desired preceramic coating.

The resultant coating is then heated in an oxidizing environment which causes hydrolysis of the SiN bonds and loss of nitrogen to thereby facilitate conversion of the silazane to silica. In addition, other functional groups on silicon are removed by such an environment. Oxidizing environments such as those comprising air, $O_2$, ozone, moisture, oxygen plasma, ammonia, amines, etc. may be used. Although the preferred environment will vary depending on the silazane, it is often preferred to heat under a wet ammonia atmosphere (ammonia and water vapor) and then under a dry ammonia atmosphere to effect removal of any remaining Si—OH groups and/or other functionality.

The silazane is subjected to the reactive environments at a temperature sufficient for ceramification. Generally, this temperature is about 20° to about 1000° C. depending on the reactive atmosphere. Preferred temperatures are in the range of about 50° to about 800° C. Higher temperatures usually result in quicker and more complete ceramification, but said temperatures may also have detrimental effects on various temperature sensitive substrates. For temperature sensitive substrates, temperatures in the range of about 100° to about 500° C. are often preferred. The silazane coatings are usually subjected to these temperatures for a time sufficient to ceramify the coating, generally up to about 6 hours, with a range of up to about 2–4 hours being preferred.

Any source of heat such as a hot plate, a convection oven, rapid thermal processing, or radiant or microwave energy can be used during the pyrolysis step.

By the above methods a silica planarizing coating is produced on the substrate. The coating smooths the irregular surfaces of various substrates and has excellent adhesion. In addition, this coating can be quite thick (e.g., >0.5 microns). This coating may also be covered by other coatings such as further $SiO_2$ coatings, $SiO_2$-modifying ceramic oxide layers, silicon containing coatings, silicon carbon containing coatings, silicon nitrogen containing coatings, silicon nitrogen carbon containing coatings and/or diamond like carbon coatings. Such multilayer coatings are taught in U.S. Pat. No. 4,973,526, which is incorporated herein by reference.

The following non-limiting Examples are provided so that one skilled in the art may more readily understand the invention.

EXAMPLE 1

Hydridopolysilazane polymer produced by the method of U.S. Pat. No. 4,540,803 was diluted to 10 wt. % in toluene. Several drops of this solution were applied to the surface of a 1 inch square silicon wafer and the wafer was spun at 3000 RPM for 35 seconds. The coated wafer was then pyrolyzed at 400° C. for 3 hours in air. The resultant coating was 0.4751 micrometers thick and had a refractive index of 1.459 at 8300 lambda (silica=1.462).

FTIR spectra were run before and after pyrolysis. A comparison of these spectra showed that most of the SiH and SiOH had been removed by heating but that some Si—$CH_3$ remained.

EXAMPLES 2–4

Hydridopolysilazane polymer produced by the method of U.S. Pat. No. 4,540,803 was diluted in toluene to the concentration indicated in Table 1. Several drops of this solution were applied to the surface of a 1 inch square silicon wafer and the wafer was spun at 3000 RPM for 35 seconds. The coated wafer was then pyrolyzed as indicated in Table 1. The results are set forth in Table 1.

TABLE 1

| Ex No | Conc (wt %) | Pyrolysis Conditions | Results |
|---|---|---|---|
| 2 | 10 | 2 hr/175° C./ moist air | Little if any reaction occurred |
| 3 | 10 | 3 hr/180° C./ozone | FTIR - SiH gone; some SiOH still present; coating thickness = 0.1912 microns; RI = 1.443 (8300 lambda) |
| 4 | 25 | 3 hr/400° C./wet ammonia and 2 hr/ 400° C./ammonia | FTIR - SiH and SiOH gone; coating thickness = 0.9349 microns; RI = 1.472 (4050 lambda) |

EXAMPLE 5

Hydridopolysilazane polymer produced by the method of U.S. Pat. No. 4,540,803 was diluted to 10 wt. % in heptane. Several drops of this solution were applied to the surface of a 1 inch square silicon wafer and a 14011B CMOS device. The wafer and device were spun at 3000 RPM for 20 seconds. The coated wafer and device were then pyrolyzed at 175° C. for 1 hour in 4.5–4.7% ozone. A comparison of the FTIR spectra before and after conversion indicated that all of the organic and amine substitution had disappeared, but a lot of SiOH was still present.

In order to remove the silanol functionality, the coated wafer and device were heated in aqueous ammonia for 3 hours at 175° C. The FTIR spectra indicated that a majority of the silanol had been removed. The CMOS device was operational after coating. The resultant coating was 0.2944 micrometers thick and had a refractive index of 1.455 at 5040 lambda.

EXAMPLE 6

Hydridopolysilazane polymer produced by the method of U.S. Pat. No. 4,540,803 was diluted to 10 wt. % in xylene/toluene. Several drops of this solution were applied to the surface of a 4 inch silicon wafer which was spun at 3000 RPM for 35 seconds. The coated wafer was then pyrolyzed at 350°–380° C. for 4 hours in aqueous ammonia vapor. A comparison of the FTIR spectra before and after conversion indicated that the coating had been converted to silica. The coating was 0.1130 micrometers thick and had a refractive index of 1,416 at 5040 lambda.

EXAMPLE 7

Hydridopolysilazane polymer produced by the method of U.S. Pat. No. 4,540,803 was diluted to 22 wt.

% in heptane. Several drops of this solution were applied to the surface of a 1 inch square silicon wafer and a 2 inch square alumina substrate. The wafer and substrate were spun at 3000 RPM for 20 seconds. The coated wafer was then pyrolyzed at 800° C. for 1 hour in air. FTIR spectra were run before and after pyrolysis and they showed conversion to silica. The coatings were 2.0745 micrometers thick after 2 coats and had a refractive index of 1,458 at 4050 lambda. The coatings on the silicon and alumina substrates were examined at 1000 X and found to have no cracks.

That which is claimed is:

1. A method for depositing a silica coating on an electronic substrate comprising:

applying a coating comprising a silazane polymer on an electronic substrate, wherein the silazane is selected from the containing disilane of the formula $(Cl_xR_ySi)_2$ with a disilazane of group consisting of silazanes prepared by reacting a chlorine the formula $(R_3'Si)_2NH$, wherein R is vinyl, an alkyl group of 1–3 carbon atoms or a phenyl group; R' is vinyl, hydrogen an alkyl group of 1–3 carbon atoms or a phenyl group; x has a value of 0.5–3; y has a value of 0–2.5 and the sum of x+y equals 3 and silazane polymers prepared by reacting trichlorosilane with a disilazane of the formula $(R''_3Si)_2NH$, where R'' is selected from the group consisting of vinyl, hydrogen, phenyl and alkyl radicals containing 1 to 3 carbon atoms; and heating the coated substrate in an oxidizing atmosphere at a temperature sufficient to convert the silazane polymer to a silica coating.

2. The method of claim 1 wherein the coating is formed by a method comprising dissolving the silazane polymer in a solvent to form a solution, coating the substrate with the solution and evaporating the solvent.

3. The method of claim 2 wherein the solvent is selected from the group consisting of aromatic hydrocarbons, alkanes, ketones, esters, glycol ethers, and cyclic dimethylpolysiloxanes and the solvent is present in an amount sufficient to dissolve the silazane to a 0.1–50 weight percent solution.

4. The method of claim 1 wherein the oxidizing atmosphere is selected from the group consisting of air, oxygen, ozone, water vapor, oxygen plasma, ammonia, amines and combinations of the above.

5. The method of claim 1 wherein the coated substrate is heated to a temperature between about 50° and about 800° C.

6. The method of claim 1 wherein the coated substrate is heated to a temperature in the range of about 50° to about 450° C. for a time of less than about 6 hours.

7. The method of claim 1 wherein the silazane has no carbon in the repeating units of the polymer.

8. The method of claim 1 wherein the silazane comprises methylpolydisilylazane.

9. The method of claim 1 wherein the silazane comprises hydridopolysilazane.

* * * * *

UNITED STATES PATENT AND TRADEMARK OFFICE
CERTIFICATE OF CORRECTION

PATENT NO. : 5,358,739
DATED : Oct. 25, 1994
INVENTOR(S) : Ronald H. Baney, Grish Chandra, And Loren A. Haluska It is certified that error appears in the above-indentified patent and that said Letters Patent is hereby corrected as shown below:

Column 7, Lines 17-29

Please Change Claim 1 To Read As Follows:

A method for depositing a silica coating on an electronic substrate comprising:
    applying a coating comprising a silazane polymer on an electronic substrate, wherein the silazane is selected from the group consisting of silazanes prepared by reacting a chorine containing disilane of the formula $(Cl_xR_ySi)_2$ with a disilazane of the formula $(R_3'Si)_2NH$, wherein R is vinyl, an alkyl, an alkyl group of 1-3 carbon atoms or a phenyl group; R' is vinyl, hydrogen an alkyl group of 1-3 carbon atoms or a phenyl group; x has a value of 0.5-3; y has a value of 0-2.5 and the sum of x+y equals 3 and silazane polymers prepared by reacting trichlorosilane with a disilazane of the formula $(R''_3Si)_2NH$, where R" is selected from the group consisting of vinyl, hydrogen, phenyl and alkyl radicals containing 1 to 3 carbon atoms; and heating the coated substrate in an oxidizing atmosphere at a temperature sufficient to convert the silazane polymer to a silica coating.

Signed and Sealed this

Second Day of May, 1995

BRUCE LEHMAN

Attest:

Attesting Officer

Commissioner of Patents and Trademarks